United States Patent
Kang et al.

(10) Patent No.: US 7,804,291 B2
(45) Date of Patent: *Sep. 28, 2010

(54) SEMICONDUCTOR TEST DEVICE WITH HEATING CIRCUIT

(75) Inventors: Seung H. Kang, Sinking Spring, PA (US); Lisa E. Mullin, Pottsville, PA (US); Subramanian Karthikeyan, Schnecksville, PA (US); Sailesh M. Merchant, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/673,714

(22) Filed: Feb. 12, 2007

(65) Prior Publication Data

US 2007/0168818 A1 Jul. 19, 2007

Related U.S. Application Data

(63) Continuation of application No. 10/952,453, filed on Sep. 28, 2004, now abandoned.

(51) Int. Cl.
*G01R 31/00* (2006.01)
*G01R 31/319* (2006.01)
*G01R 31/28* (2006.01)

(52) U.S. Cl. .................. 324/158.1; 324/765; 324/760

(58) Field of Classification Search .................. None
See application file for complete search history.

(56) References Cited

U.S. PATENT DOCUMENTS

| | | | | |
|---|---|---|---|---|
| 4,356,379 A | * | 10/1982 | Graeme | 219/209 |
| 4,505,803 A | * | 3/1985 | Mase et al. | 204/425 |
| 4,571,608 A | * | 2/1986 | Johnson | 136/207 |
| 4,580,439 A | * | 4/1986 | Manaka | 73/31.06 |
| 5,233,161 A | * | 8/1993 | Farwell et al. | 219/209 |
| 5,898,706 A | * | 4/1999 | Dufresne et al. | 714/745 |
| 5,985,673 A | * | 11/1999 | Bao et al. | 436/151 |
| 6,060,895 A | * | 5/2000 | Soh et al. | 324/760 |
| 6,136,619 A | * | 10/2000 | Ceuninck et al. | 438/18 |
| 6,157,046 A | * | 12/2000 | Corbett et al. | 257/48 |
| 6,293,698 B1 | * | 9/2001 | Alvis | 374/164 |
| 6,301,280 B1 | * | 10/2001 | Broutin et al. | 372/38.01 |
| 6,559,667 B1 | * | 5/2003 | Tarter | 324/760 |
| 6,720,261 B1 | * | 4/2004 | Anderson et al. | 438/687 |
| 6,787,799 B2 | * | 9/2004 | Asam et al. | 257/48 |
| 6,873,170 B2 | * | 3/2005 | Asam et al. | 324/765 |
| 7,061,264 B2 | * | 6/2006 | Kang et al. | 324/765 |
| 7,327,152 B2 | * | 2/2008 | Fischer et al. | 324/763 |
| 7,388,395 B2 | * | 6/2008 | Kang et al. | 324/765 |
| 2004/0069339 A1 | * | 4/2004 | Dai | 136/203 |

FOREIGN PATENT DOCUMENTS

GB  2330003 A  * 4/1999

OTHER PUBLICATIONS

"Electromigration Interconnect Lifetime Under AC and Pulse DC Stress" by Liew et al. 1989 IEEE/IPRS, pp. 215-219.*

* cited by examiner

*Primary Examiner*—Paresh Patel

(57) ABSTRACT

A semiconductor test device includes a test circuit having contacts for applying an electrical signal and measuring electrical parameters of the test circuit. The semiconductor test device also includes an integrally formed heating circuit comprising at least one circuit meander positioned adjacent the test circuit for raising a temperature within a portion of the test circuit.

11 Claims, 13 Drawing Sheets

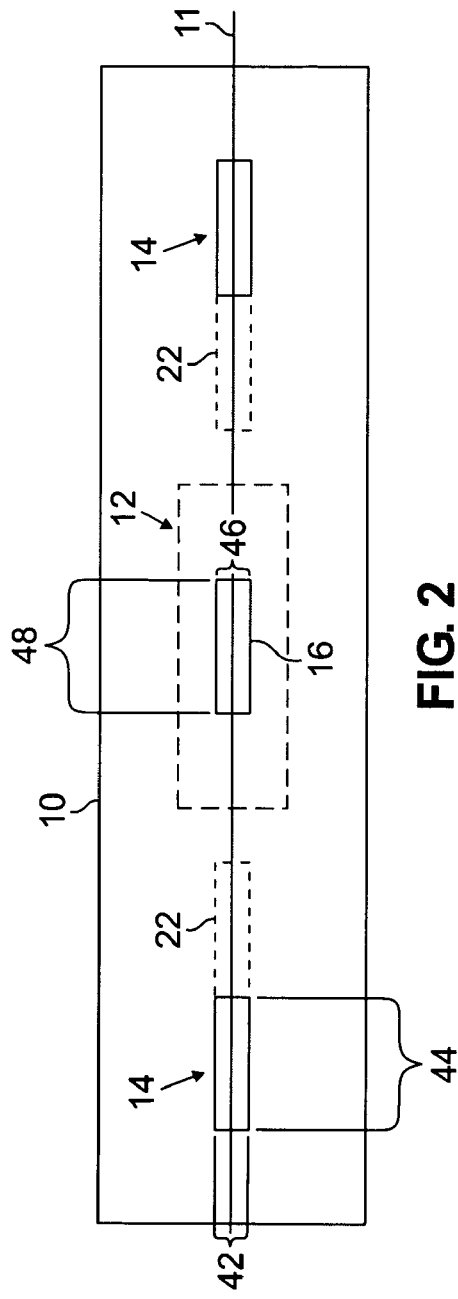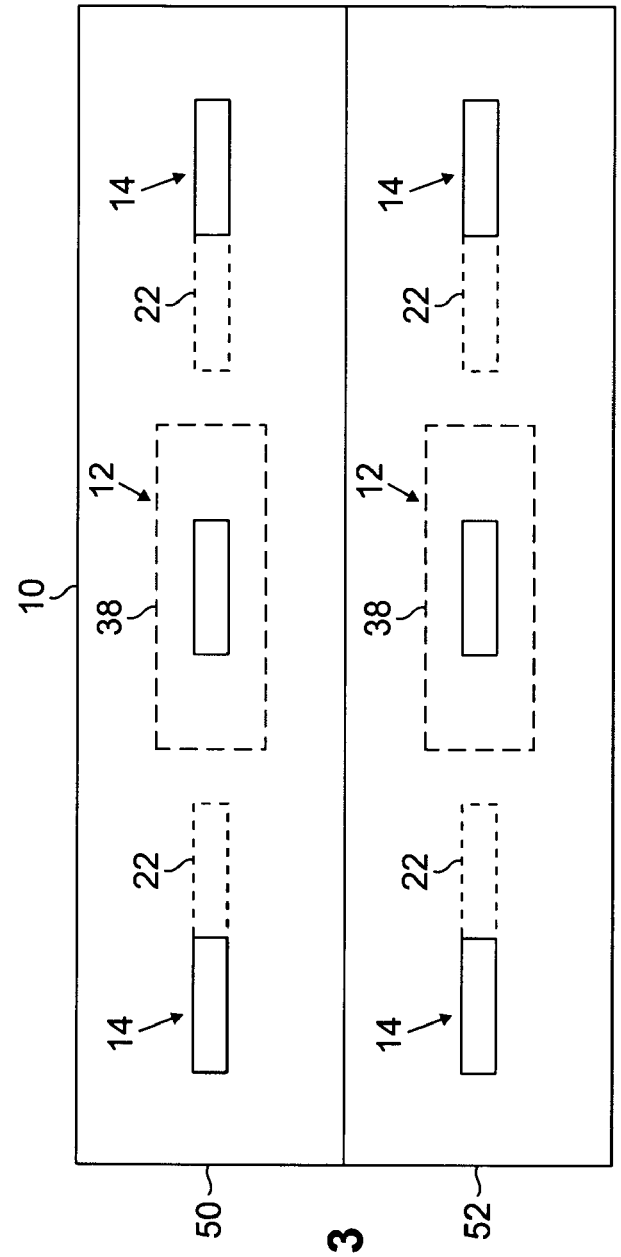

SEMICONDUCTOR TEST DEVICE WITH HEATING CIRCUIT

CROSS-REFERENCE TO RELATED APPLICATIONS

This application is a continuation of co-pending U.S. patent application Ser. No. 10/952,453, filed on Sep. 28, 2004, which is incorporated herein by reference.

FIELD OF THE INVENTION

The invention is generally related to the field of semiconductor devices and, more particularly, to a semiconductor wafer having an integrally formed heating element.

BACKGROUND OF THE INVENTION

A well-known problem area affecting semiconductor reliability is thermal reliability. Consequently, thermal analysis is an important part of testing semiconductor devices. In particular, measurements of cyclic thermal loading on interconnect behavior, such as thermal fatigue and Joule heating that affect the known phenomena of electro-migration and stress migration of interconnects, are necessary to assess reliability of a semiconductor circuit. Conventional techniques for assessing the reliability of a semiconductor circuit include assembling the circuit in a ceramic or similar package, heating the package using external heating sources such as by placing the package in a temperature controlled chamber, applying heat to the package, while applying a direct current (DC) signal to the circuit and monitoring changes in the signal as the circuit is heated. For example, heat induced stress migration effects on a circuit may be studied by exposing the circuit to isothermal heating conditions and measuring the resistance change of the circuit. However, conventional thermal fatigue testing of a semiconductor circuit may become excessively time consuming due to the amount of time required to heat the circuit using external sources. For example, it may be difficult to ramp temperatures up and down as quickly as would be commonly experienced by a semiconductor device being used in the field.

BRIEF DESCRIPTION OF THE DRAWINGS

FIG. 2 shows a cross-sectional view of the semiconductor wafer of FIG. 1 taken along line 2-2.

FIG. 3 shows a cross-sectional view of an exemplary semiconductor test wafer comprising two layers, each layer comprising a reliability test circuit and heating circuit formed with the wafer.

It is to be understood that the following detailed description is exemplary and explanatory only and is not to be viewed as being restrictive of the present, as claimed. These and other aspects, features and advantages of the present invention will become apparent after a review of the following description of the preferred embodiments and the appended claims.

DESCRIPTION OF PREFERRED EMBODIMENTS

Figure 1:
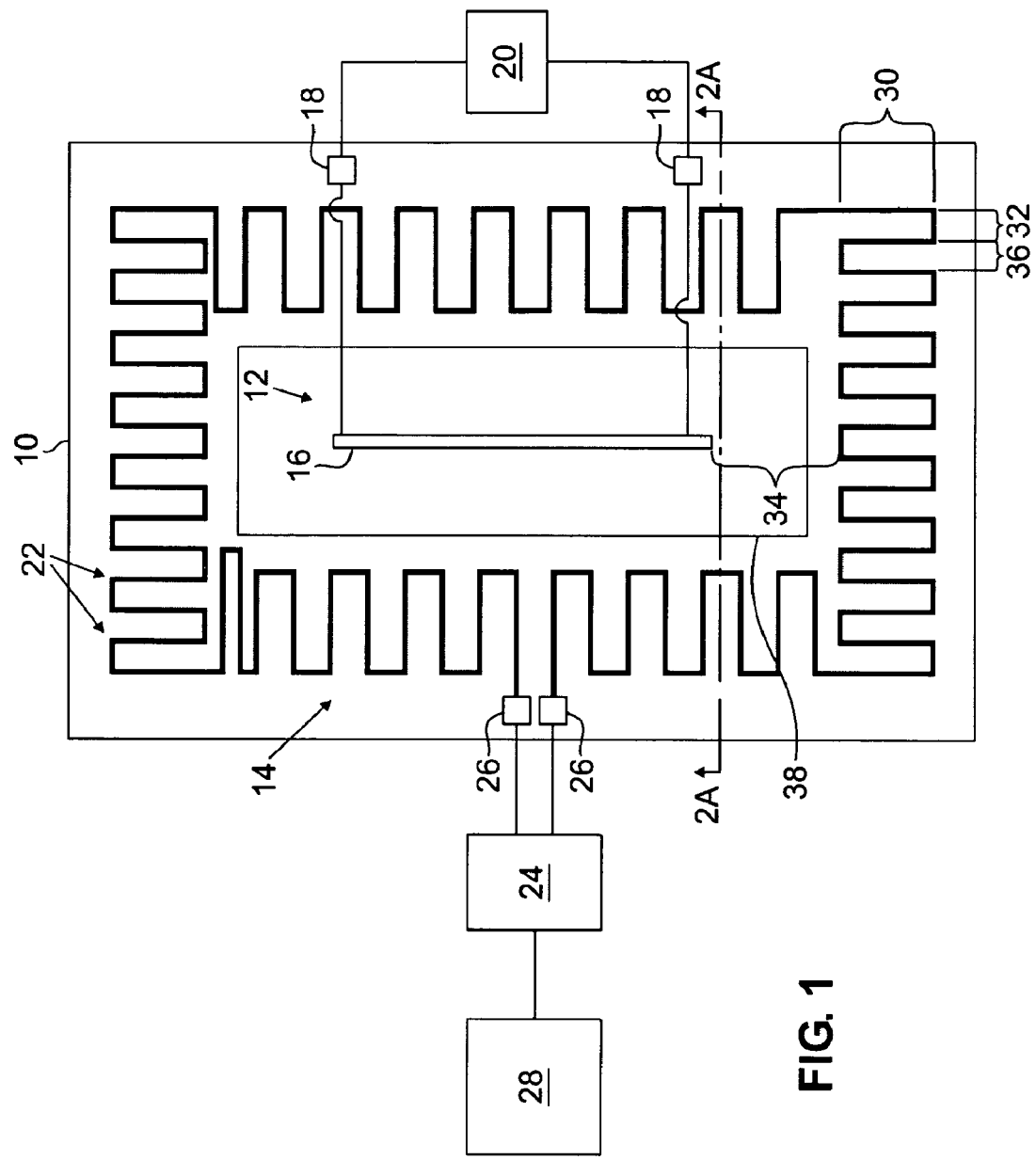
FIG. 1 shows a top view of an exemplary semiconductor test wafer cut away to reveal a reliability test circuit and heating circuit formed with the wafer.

FIG. 1 shows a top view of an exemplary semiconductor test wafer 10 cut away to reveal a reliability test circuit 12 and an innovative heating circuit 14 integrally formed with the wafer 10 adjacent the reliability test circuit 12. In an aspect of the invention, the reliability test circuit 12 may include a known standard Joint Electron Device Engineering Council (JEDEC) tester, as described in JEDEC standard JESD87, or an extrusion test circuit used to measure metal extrusion phenomena during electro-migration testing, or a similar test structure used to assess interconnect reliability for resistance to electro-migration, stress-induced voiding, or stress migration. In an aspect of the invention, the reliability test circuit 12 may include one or more conductor traces 16 having contacts 18 for applying and measuring electrical signals by a tester 20 connected to the contacts 18. Typically, the conductor trace 16 is disposed coplanar with a horizontal plane of the test circuit 12 as indicated by line 11 shown in FIG. 2. The conductor trace 16 may be connected to additional contacts (not shown) for applying different test signals and measuring electrical parameters corresponding to the different applied test signals. In addition, more than one conductor trace 16 may be used. For example, a second conductor trace (not shown) may be positioned parallel to the conductor trace 16 and a capacitance or shorting characteristic between the conductor traces may be measured to monitor the effects of heating on the reliability test circuit 12. The tester 20 may include a current source and/or voltage source for applying a desired constant or variable electrical signal. The tester 20 may also include appropriate meters for measuring electrical parameters of the test circuit 12 corresponding to an applied electrical signal.

The heating circuit 14 may be integrally formed with the wafer, such as by using known semiconductor manufacturing processes, and includes a plurality of circuit meanders 22 positioned adjacent the conductor trace 16. For example, the meanders 22 may be oriented parallel with a plane of the reliability test circuit 12, such as coplanar with the circuit 12, and may surround a periphery 38 of the circuit 12. The heating circuit 14 may be powered by an alternating current (AC) source 24 connected via contacts 26 for inducing heating in the heating circuit as a result of known $I^2R$ heating effects, where "I" is an amperage of the AC current provided to the heating circuit 14, and "R" is the resistance of the heating circuit 14. The heat generated by the heating circuit 14 is conducted through the surrounding insulating or dielectric material 13 of the wafer 10 to impart heating to the conductor trace 16 of the test circuit 12 positioned adjacent to the heating circuit 14. The meanders 22 of the heating circuit 14 may be configured to provide a desired level of heating to the conductor trace 16 based on parameters such as a meander length 30, a meander width 32, a spacing 36 between meanders, and a spacing 34 between the meander 22 and the conductor trace 16. In an aspect of the invention depicted in FIG. 2, a cross sectional width 44 and height 42 of a heating circuit trace 40 may be about the same as a width 48 and height 46 of the conductor trace 16.

The overall resistance of the meander 22 may be altered by adjusting parameters such as meander length 30, meander width 32, spacing 36 between meanders and spacing 34 between the meander 22 and the conductor trace 16.

To provide additional control over heating the reliability test circuit 12, the AC source 24 may be controlled by controller 28 to provide a desired level of heating based on parameters such as amperage (measured, for example, as a root mean square of the amplitude of an AC signal) a frequency, and/or a duty cycle of the AC current. For example, the controller 28 may control the AC source 24 to produce an AC current having an amperage and frequency sufficiently close to an amperage and frequency of an AC signal that a conductor trace may be subjected to when used in a semiconductor device. In another aspect of the invention, the AC source 24 may be cycled on and off in a desired duty cycle to expose the conductor trace 16 to cyclic thermal cycling, for example to simulate a cyclic thermal cycle that a conductor trace may be subjected to when used in a semiconductor device. The heating circuit 14 is able to provide sufficient heat to the circuit trace 16 of the test circuit 12 by conducting an AC current having a higher amperage than a current used in typical semiconductor devices without the heating circuit being subject to electro-migration. Because the heating circuit 14 conducting such an AC current may not be affected by electro-migration, the heating circuit 14 may be allowed to operate at a temperature exceeding a standard operating temperature of the semiconductor device to study effects of heating. For example, for circuits having interconnects formed of aluminum alloys, the temperatures may be raised to as high as 450° Centigrade (C.), and for copper interconnects, the temperatures may be raised to as high as 500° (C.), taking into account the limitations of barriers and thermal properties of the materials used for the fabrication of the semiconductor wafer.

FIG. 3 shows a cross-sectional view of an exemplary semiconductor test wafer 10 comprising two layers 50, 52, each layer comprising a reliability test circuit 12 and heating circuit 14 formed with the wafer. Each layer 50, 52 of the wafer 10 may be configured as shown in FIGS. 1 and 2 so that the heating circuit 14 is coplanar and surrounds the periphery 38. The heating circuit 14 in each layer 50, 52 may be connected together and powered by a single AC source, or the heating circuits 14 in each layer 50, 52 may be powered by respective separate AC sources to control each circuit 14 independently, while measurements are being made on the reliability test circuit 12 of layers 50 and 52. The heating circuits on levels 50 and 52 may be positioned so that their meanders 22 lie orthogonal to each other or using other design practices well known in the art.

Figure 4:
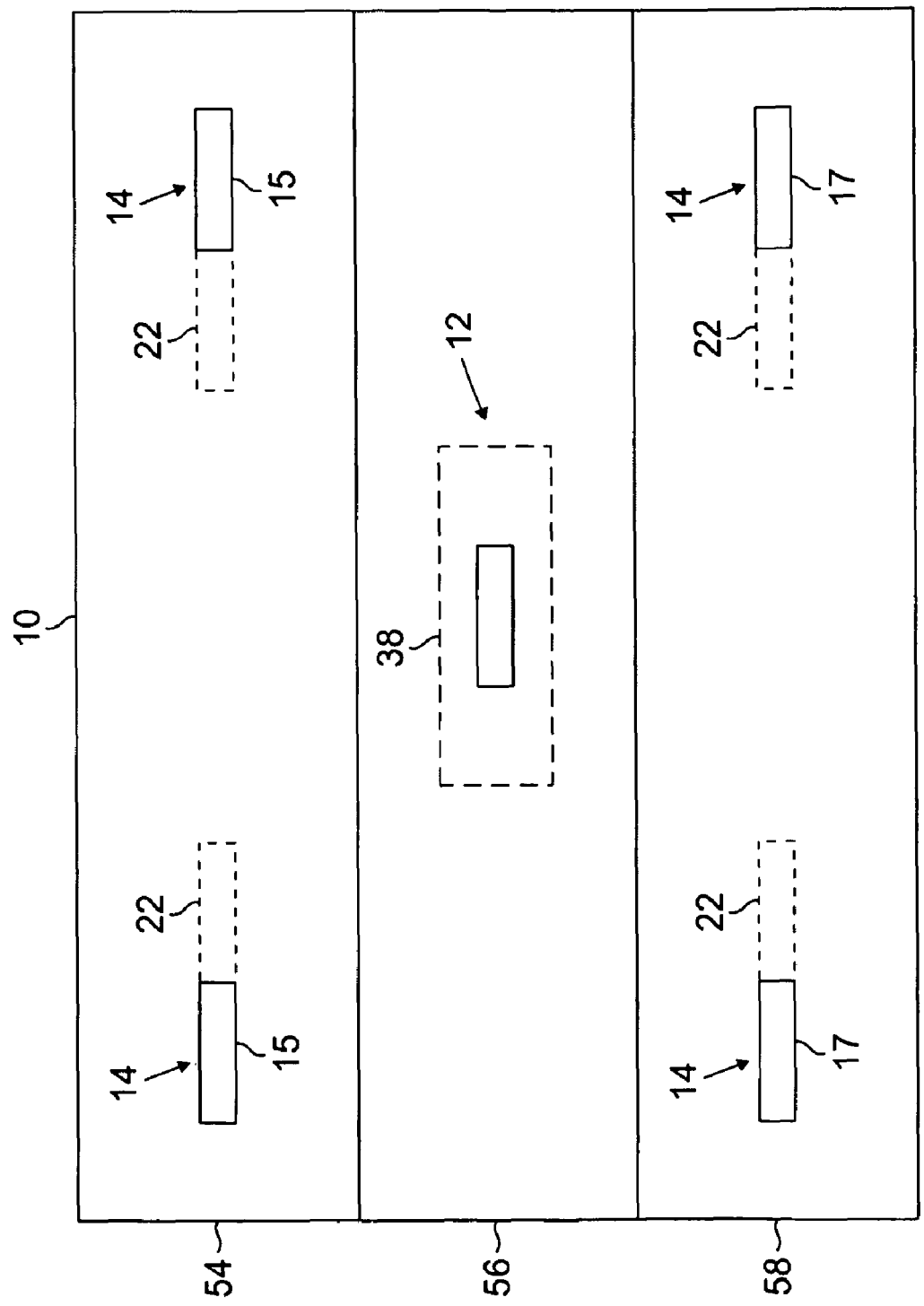
FIG. 4 shows a cross-sectional view of an exemplary semiconductor test wafer comprising three layers, a first portion of a heating circuit being positioned in a first layer, the reliability test circuit being positioned in a second layer below the first layer, and a second portion of the heating circuit being positioned in a third layer below the second layer.

FIG. 4 shows a cross-sectional view of an exemplary semiconductor test wafer 10 having the heating circuit 14 positioned in a different layer of the wafer 10 than the reliability test circuit 12. For example, the wafer 10 depicted in FIG. 4 includes three layers, a first portion 15 of a heating circuit being positioned in a first layer 54, the reliability test circuit 12 being positioned in a second layer 56 below the first layer 54, and a second portion 17 of the heating circuit being positioned in a third layer 58 below the second layer 54. The meanders 22 of the portions 15, 17 of the heating circuit 14 may be oriented parallel with a plane of the test circuit 12 and surround a periphery 38 of the reliability test circuit 12 projected onto the respective layers 54, 58. The portions 15, 17 may be powered by separate AC sources or connected together to be powered from the same AC source.

Figure 5:
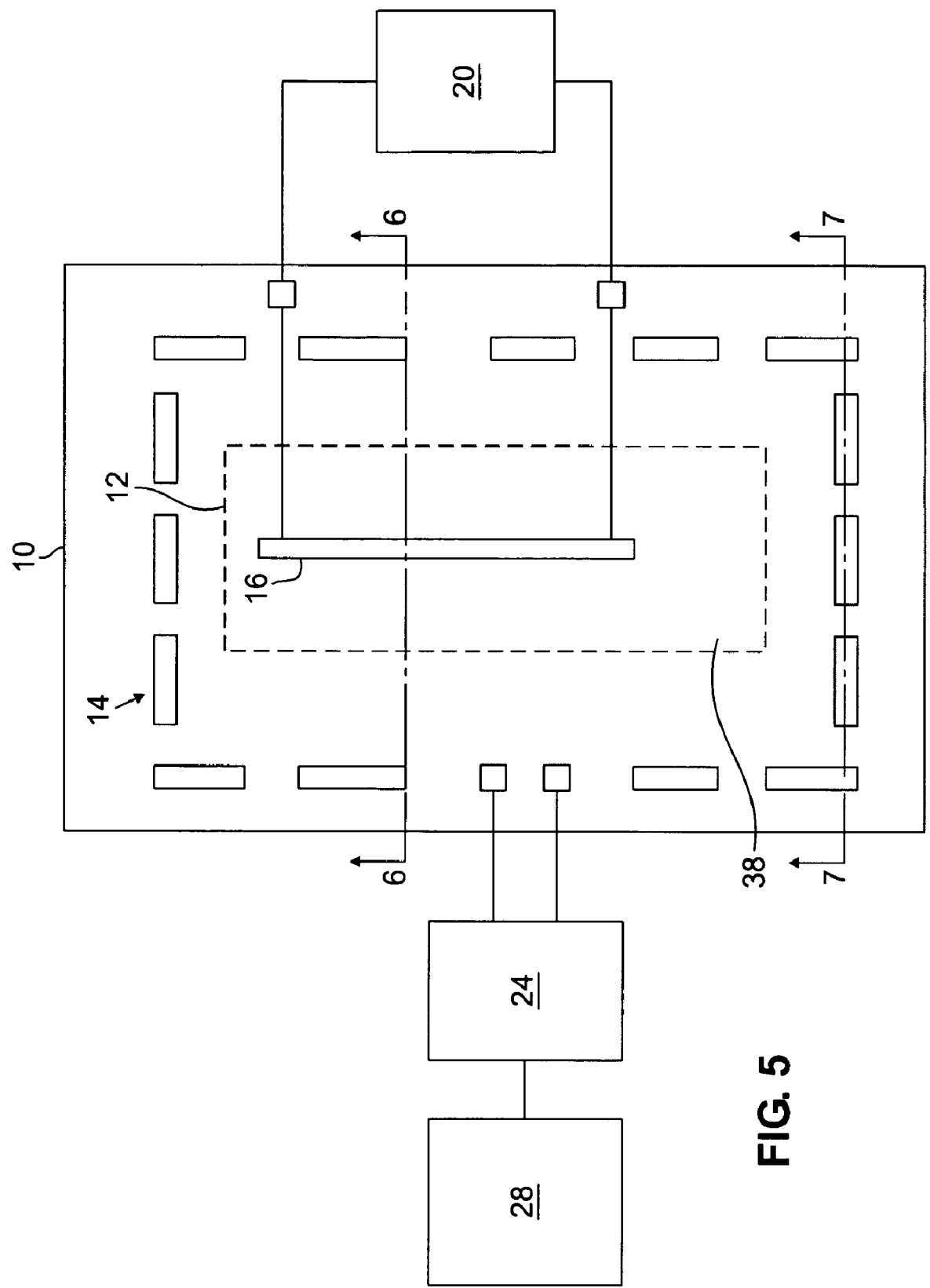
FIG. 5 shows a top view of an exemplary semiconductor test wafer cut away to reveal a reliability test circuit and heating circuit formed with the wafer.
Figure 6:
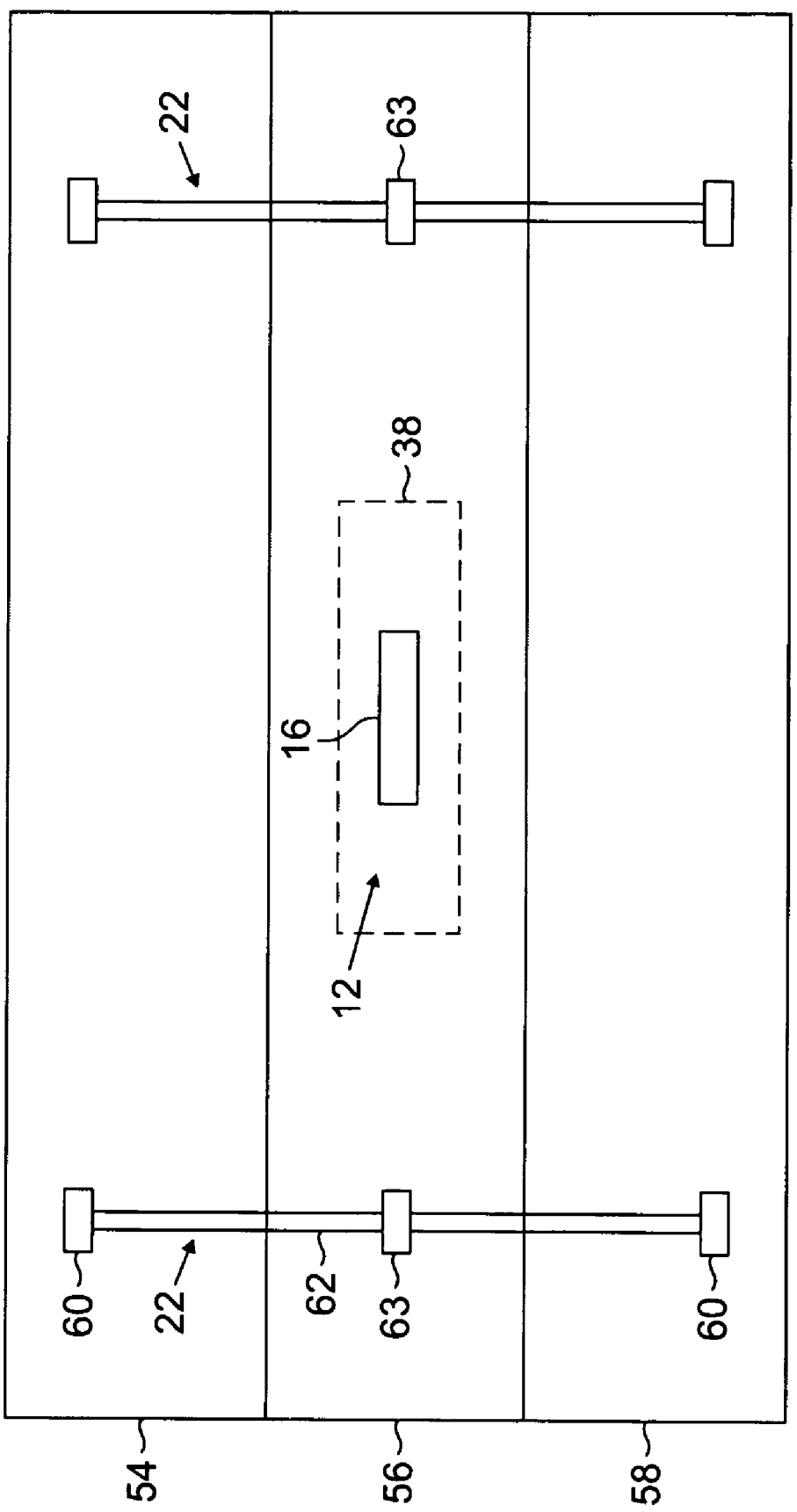
FIG. 6 shows a cross-sectional view of the semiconductor wafer of FIG. 5 taken along line 6-6.
Figure 7:
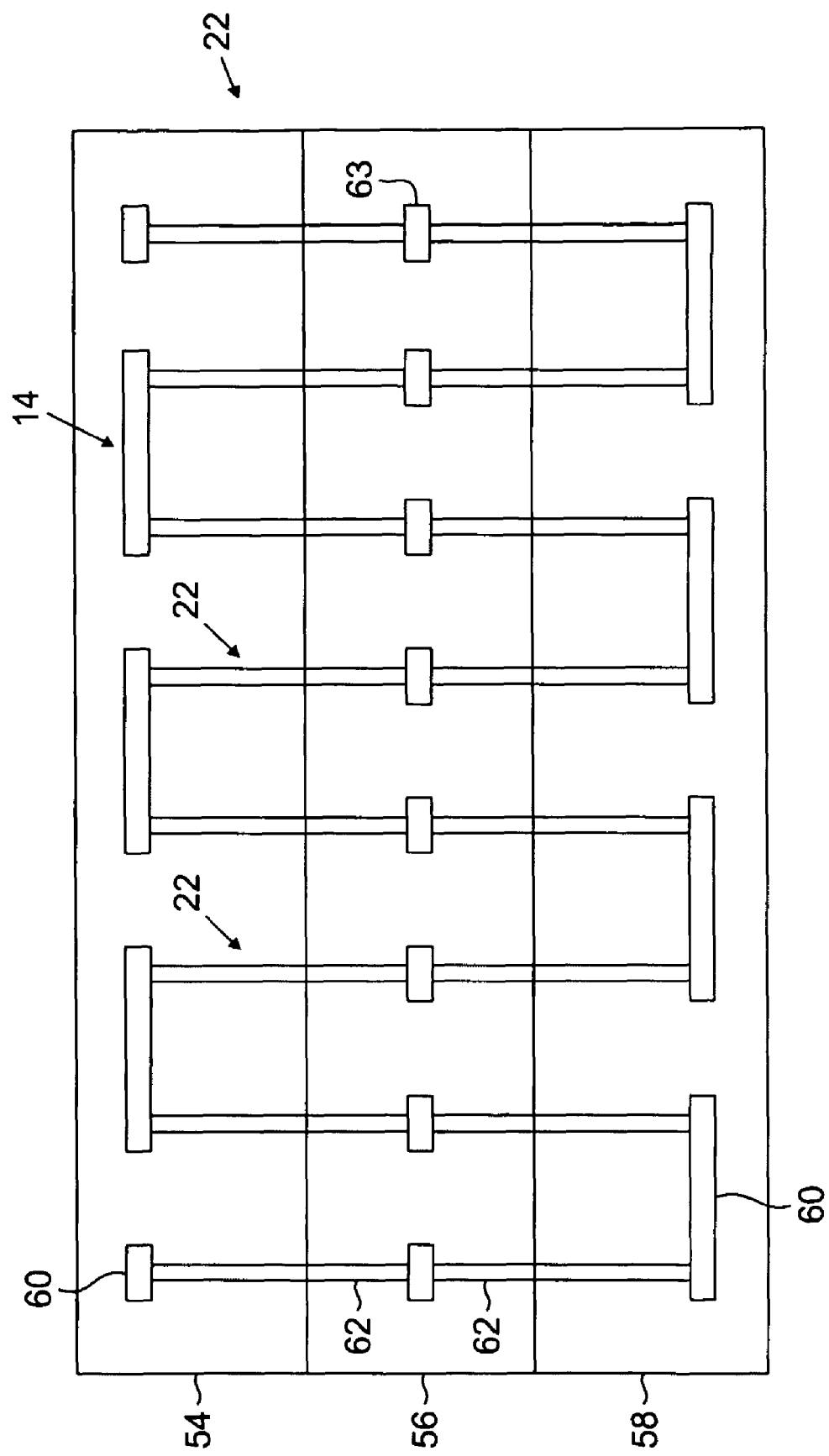
FIG. 7 shows a cross-sectional view of the semiconductor wafer of FIG. 5 taken along line 7-7.
Figure 8:
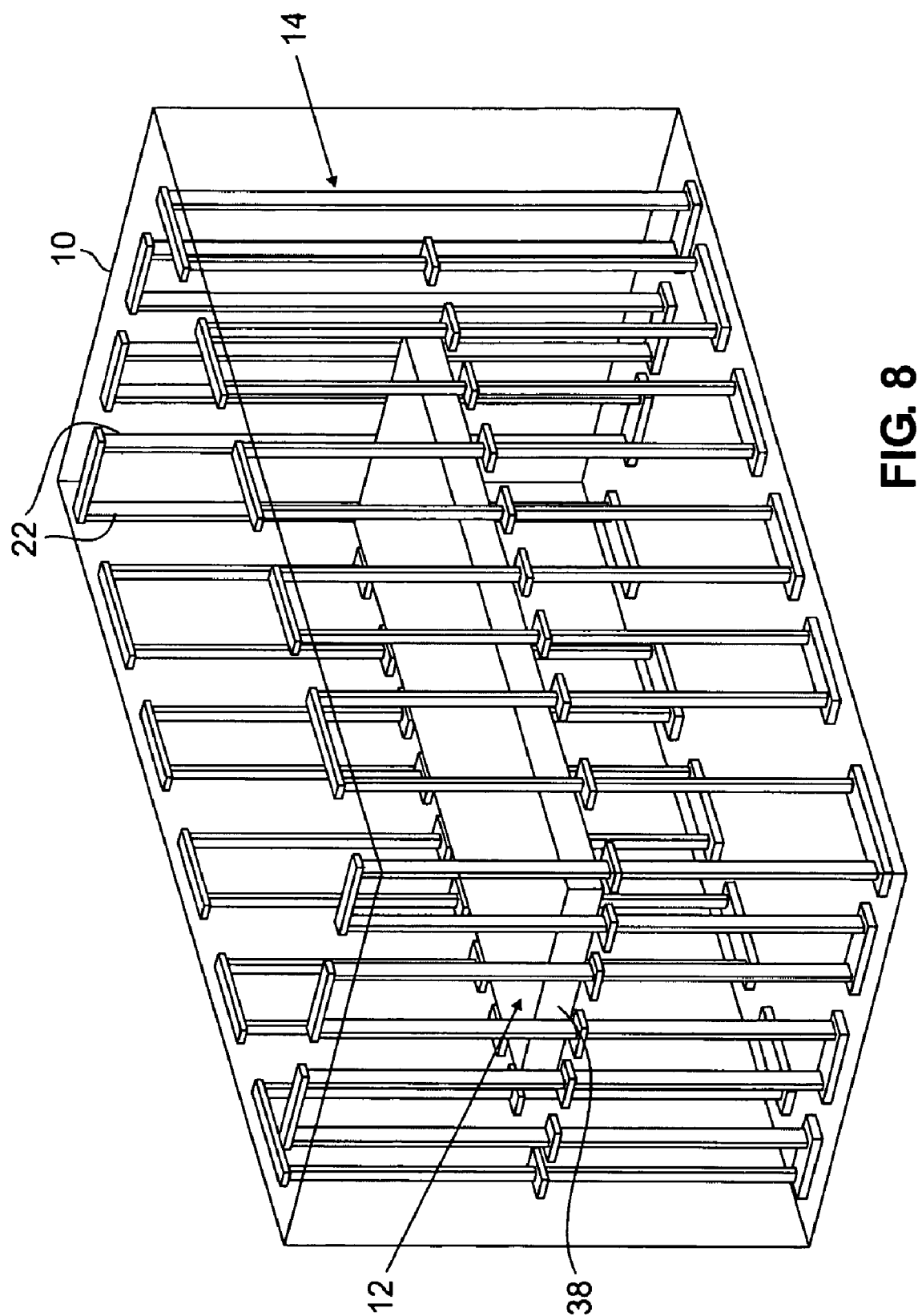
FIG. 8 depicts a transparent perspective view of the semiconductor wafer of FIG. 5 showing the heating circuit formed with the wafer.

FIG. 5 shows a top view of an exemplary embodiment of a multilayer semiconductor test wafer 10 cut away to reveal a reliability test circuit 12 positioned in a middle layer of the wafer 10. The wafer 10 also includes a heating circuit 14 formed vertically with respect to a plane of the reliability test circuit 12 and extending throughout the layers. FIG. 6 shows a cross-sectional view of the semiconductor wafer 10 of FIG. 5 taken along line 6-6, and FIG. 7 shows a cross-sectional view of the semiconductor wafer of FIG. 5 taken along line 7-7. As can be seen in FIGS. 6 and 7, the meanders of the heating circuit extend vertically though layers 54, 56, 58 and may be positioned to surround the periphery 38 of the reliability test circuit 12. The meanders 22 may comprise horizontal traces 60 formed in layers 54 and 58 and extending in a plane parallel with a plane of the reliability test circuit 12, and vertical vias 62 extending vertically through the layers 54, 56, 58 to connect the horizontal traces in layers 54 and 58 to form the heating circuit 14. The vertical vias 62 may be allowed to stack on top of one another through respective "landing pads" 63 that are coplanar with the reliability test circuit 12 and conductor trace 16. Accordingly, the heating circuit 14 forms a vertical "fence" through the layers 54, 56, 58 around a periphery 38 of the test circuit 12 as more clearly shown in FIG. 8.

Figure 9:
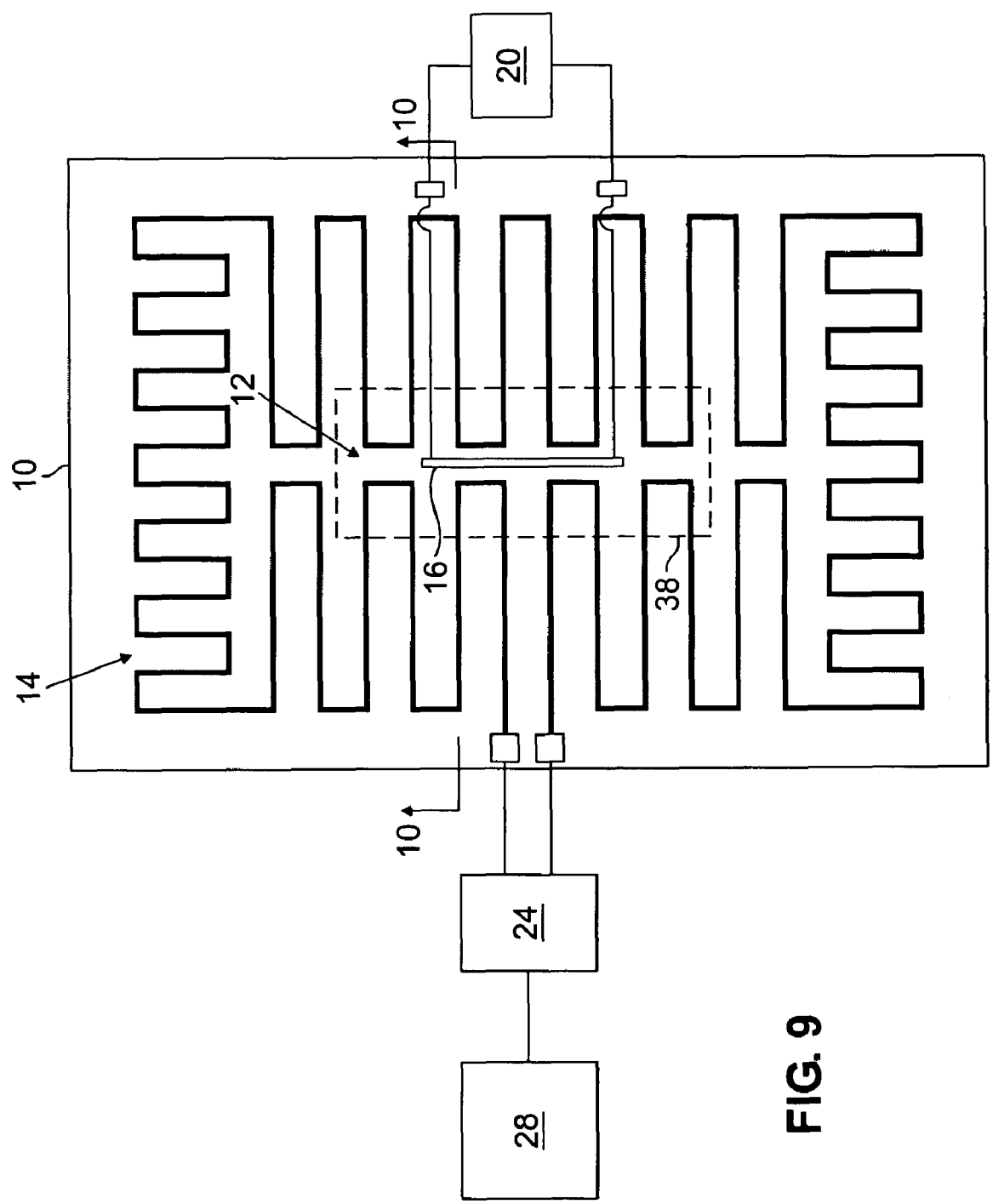
FIG. 9 shows a top view of an exemplary semiconductor test wafer cut away to reveal a reliability test circuit and heating circuit formed with the wafer.
Figure 10:
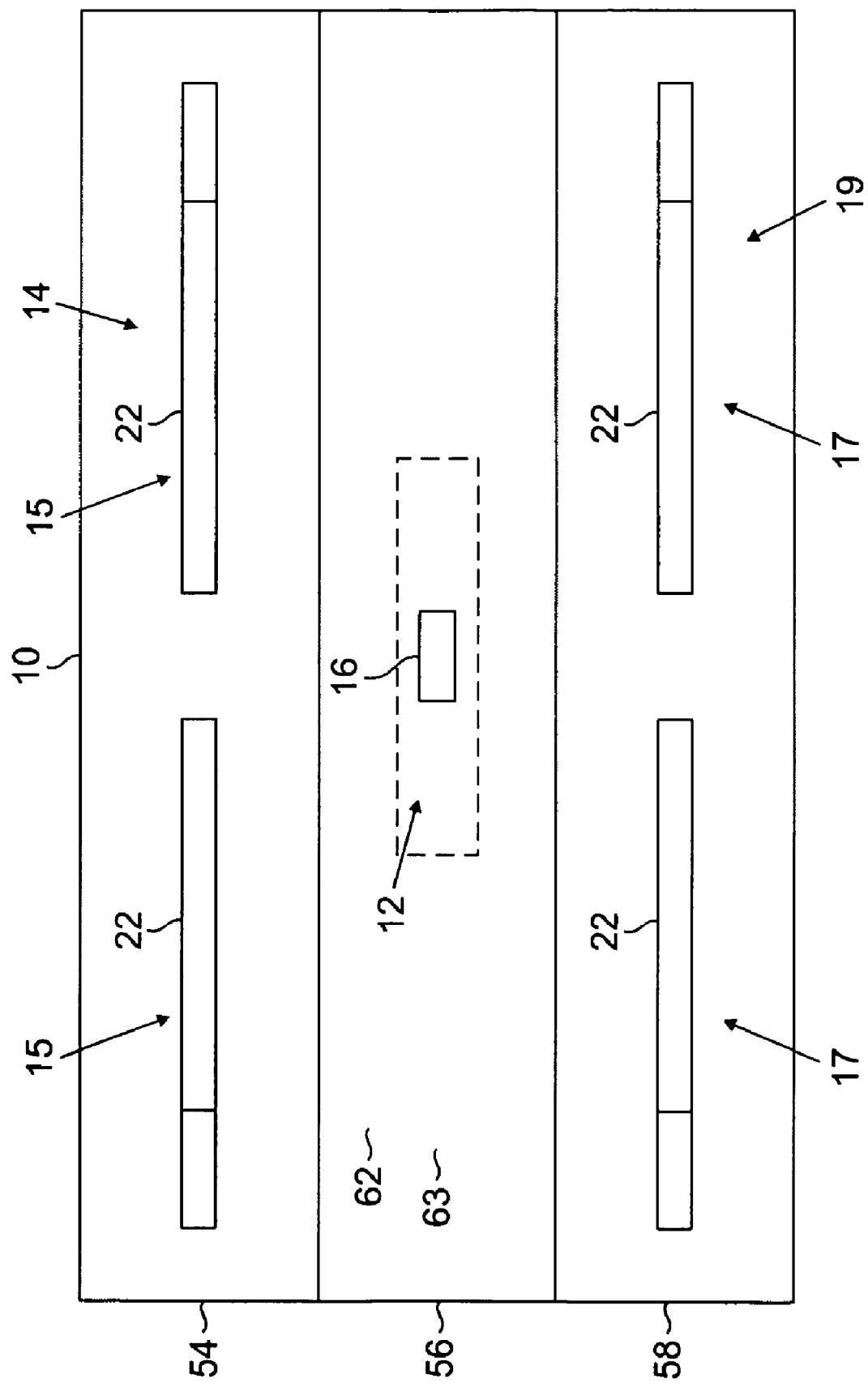
FIG. 10 shows a cross-sectional view of the semiconductor wafer of FIG. 9 taken along line 10-10.
Figure 11:
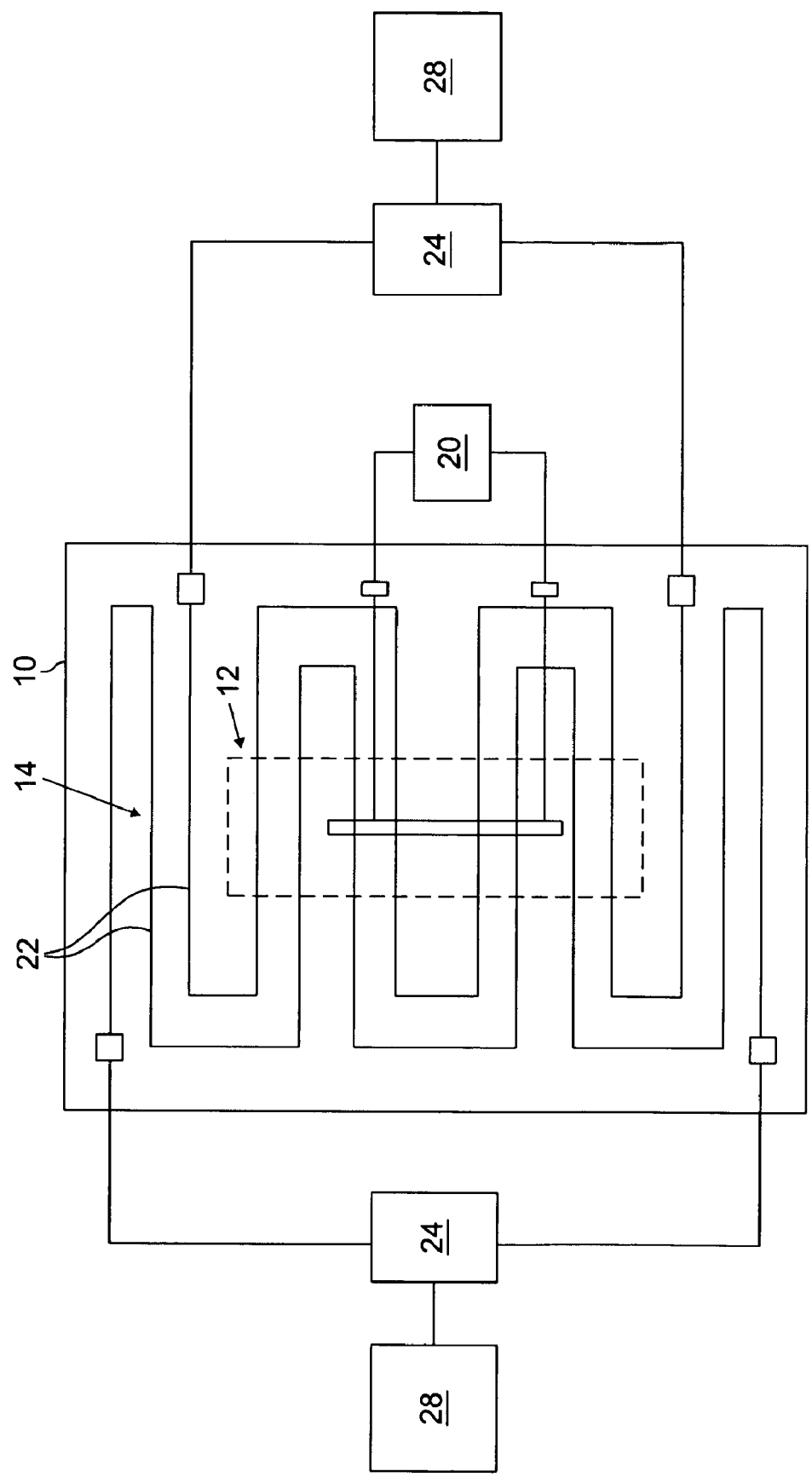
FIG. 11 shows a top view of an exemplary semiconductor test wafer cut away to reveal a reliability test circuit and heating circuit formed with the wafer.

FIG. 9 shows a top view of a multilayer semiconductor test wafer 10 cut away to reveal a reliability test circuit 12 in one of the layers. The wafer 10 also includes at least one heating circuit 14 formed in an adjacent layer 54 and overlapping a periphery 38 of the reliability test circuit 12 projected into the adjacent layer 54. FIG. 10 shows a cross-sectional view of the semiconductor wafer 10 of FIG. 9 taken along line 10-10. The wafer 10 may include three layers, a first portion 15 of a heating circuit being positioned in a first layer 54, the reliability test circuit 12 being positioned in a second layer 56 below the first layer 54, and a second portion 17 of the heating circuit 14 being positioned in a third layer 58 below the second layer 54. The meanders 22 of the portions 15, 17 of the heating circuit 14 may be oriented parallel with a plane of the conductor trace 16 and overlap a periphery 38 of the test circuit 12 projected onto the respective layers 54, 58. The portions 15, 17 may be powered by separate AC sources or connected together to be powered from the same AC source. In another aspect of the invention depicted in the cut away view of FIG. 11, the meanders 22 of the heating circuit 14, such as the portions 15, 17 shown in FIG. 10, may be interleaved, or interdigitated, between one another. In an interdigitated embodiment, the heating circuit 14 may be apportioned among the interdigitated meanders 22 and each part of the apportioned heating circuit 14 may be powered separately by respective AC sources 24.

Figure 12:
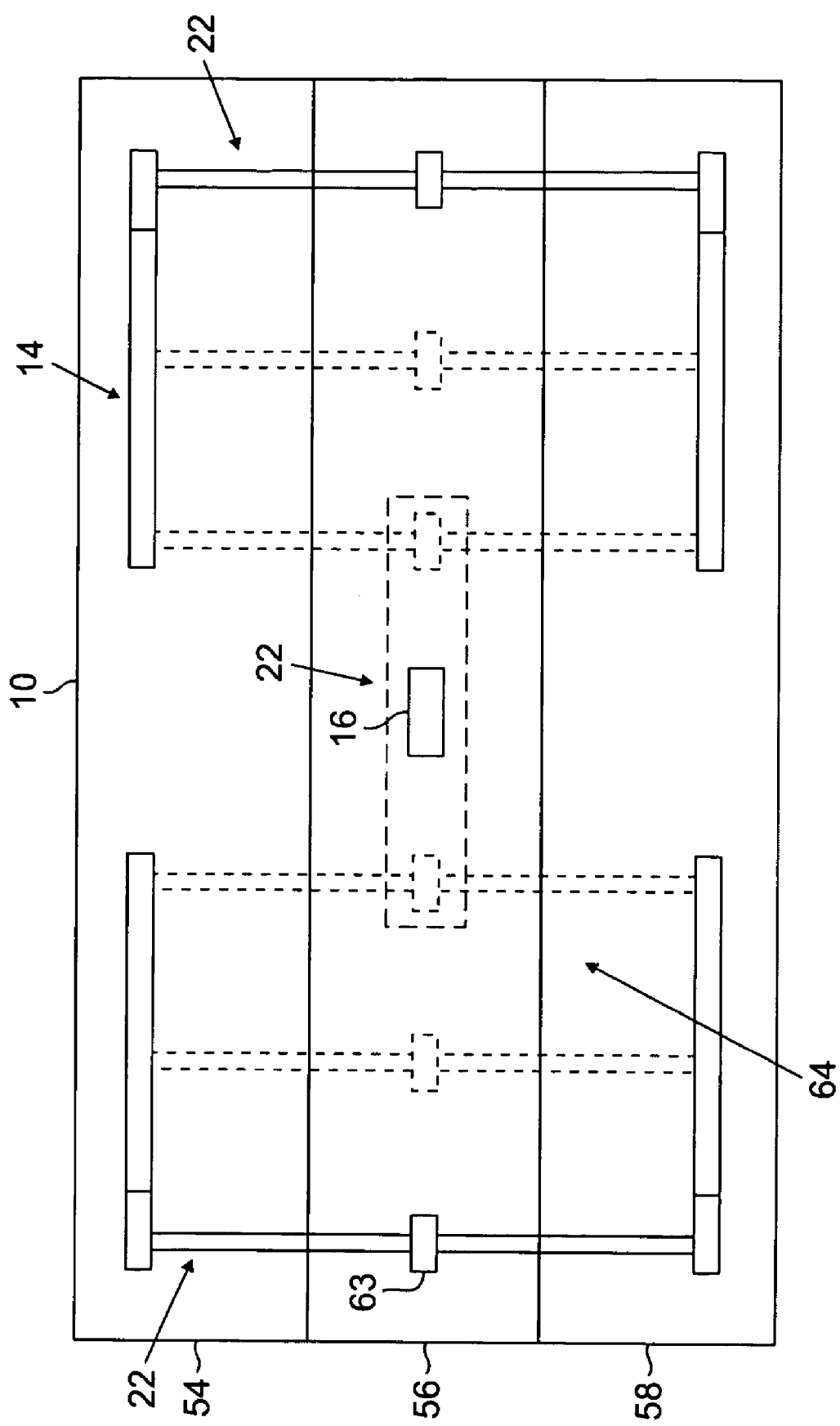
FIG. 12 shows a cross-sectional view of an exemplary semiconductor test wafer comprising portions of a heating circuit surrounding a reliability test circuit.
Figure 13:
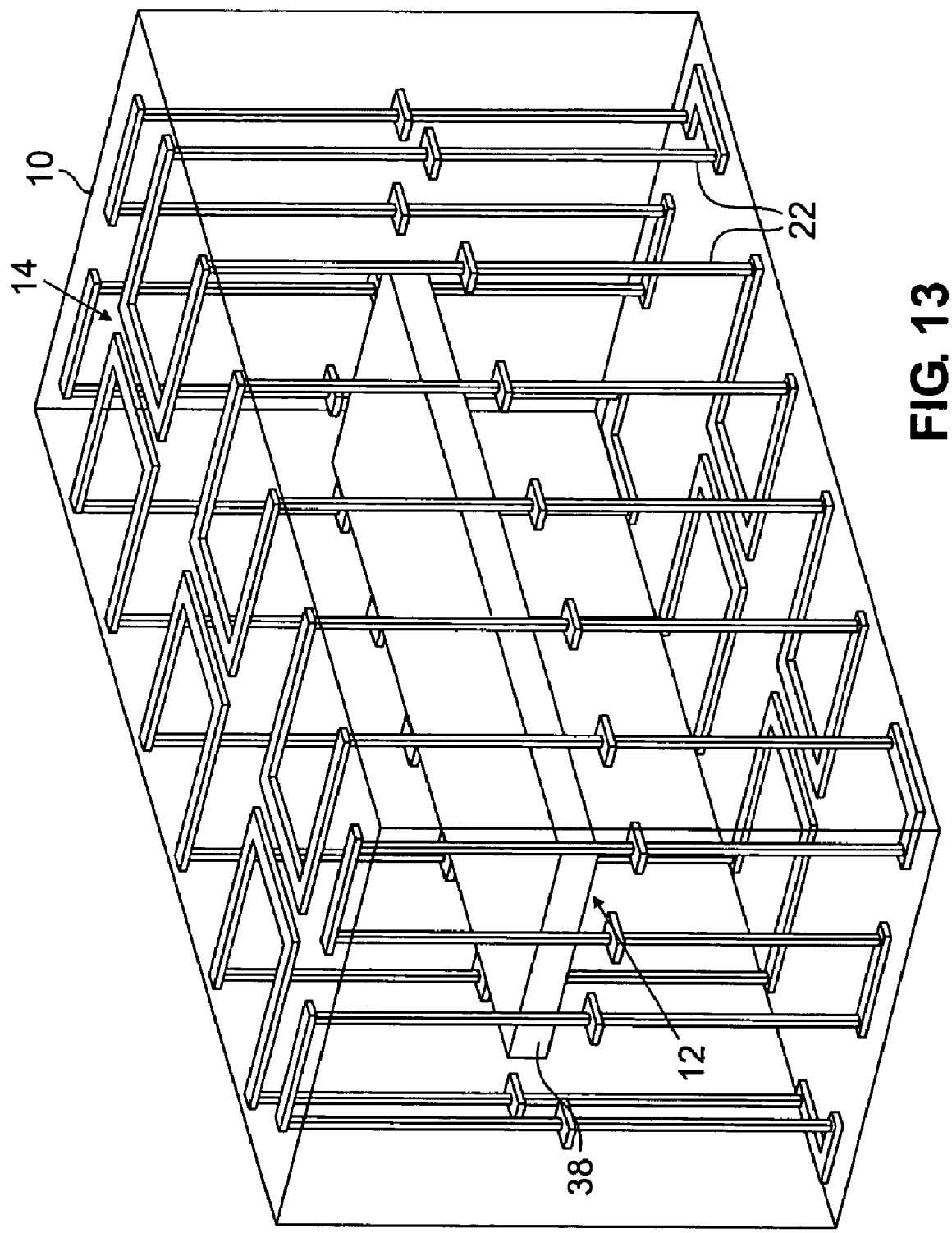
FIG. 13 depicts a transparent perspective view of the semiconductor wafer of FIG. 12 showing the heating circuit formed with the wafer.

FIG. 12 shows a cross-sectional view of a multilayer semiconductor test wafer 10 comprising portions of a heating circuit 14 surrounding reliability test circuit 12. For example, the horizontally oriented meander 22 configuration depicted in layers 54 and 58 of FIGS. 9 and 10 may be combined with the vertically oriented meander 22 configuration depicted in FIG. 8 to form a network of circuit meanders 22 positioned around the test circuit 12 to enclose the trace 16 within a space 64 defined by the meanders 22. Accordingly, the meanders 22 form a "cage" (such as shown in FIG. 13) surrounding all sides of the test circuit 12 so that the enclosed circuit 12 may be exposed on all sides to heat generated by a current running through the surrounding meanders 22. In an aspect of the invention, the heating circuit 14 may be apportioned and each part of the apportioned heating circuit 14 may be powered separately by respective AC sources. In yet another aspect, the meanders themselves may be interdigitated or interleaved as shown in FIG. 12.

Figure 14:
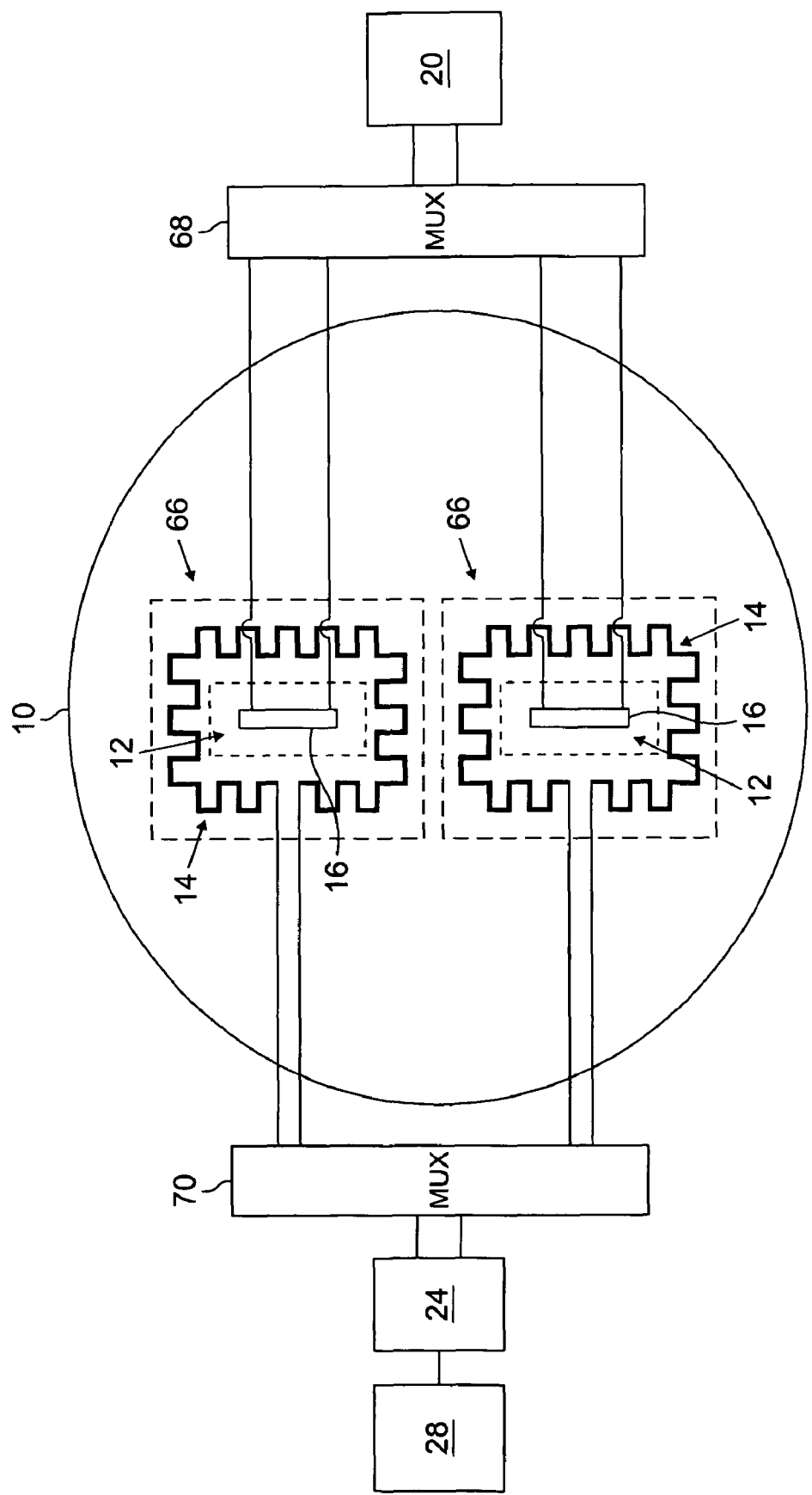
FIG. 14 shows a top view of an exemplary semiconductor test wafer cut away to reveal a plurality of test die and a plurality of heating circuits.

FIG. 14 shows a top view of an exemplary semiconductor test wafer 10 cut away to reveal a plurality of test die 66 and a heating circuit 14 associated with each test die 66. Each test die 66 may include a reliability test circuit 12 that may include one or more conductor traces 16. The heating circuit 14 associated with each die 66 may be configured as one of the heating circuits 14 described above and shown in FIGS. 1-13. Each heating circuit 14 may be connected to the AC power source 24, for example, through a multiplexer 70 for selectively providing an AC current to a desired heating circuit 14. The AC source 24 may be controlled by controller 28 to select desired parameters of the current produced, such as a frequency, an amperage and/or a duty cycle. The reliability test circuit may also be connected through a multiplexer 68 for selectively applying and measuring electrical signals by a tester 20. The AC source 24, multiplexer 70, controller 28, multiplexer 68, and tester 20 may be incorporated in a known wafer probe station to perform thermal testing of the dies 66, for example, during wafer-level testing. Multiple test die 66 may be distributed across the wafer 10 in different regions so that wafer electrical behavior in respective different regions of the wafer 10 in response to heating may be investigated. The multiple test die 66 may be removed from the wafer 10 using a dicing operation, packaged and subsequently tested for reliability using techniques well known in the art and/or in accordance with the present invention and its embodiments.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims. For example, a skilled artisan may develop different configurations of meanders, vias, and positions of meanders and vias in different layers of a semiconductor wafer, such as to form a fence or cage configuration, to produce a desired heating of one or more reliability test circuits. In addition, different portions of the heating circuit may be separately powered to achieve a desired heating effect.

The invention claimed is:

1. A method comprising the steps of:
    forming a semiconductor device including an integrated test circuit and a heating element, wherein the heating element includes a plurality of circuit meanders, one or more first meanders positioned in a horizontal plane around a test circuit, and one or more second meanders in a vertical plane around the test circuit, wherein the one or more first meanders and the one or more second meanders surround the test circuit within a three-dimensional space;
    applying power to the heating element to provide heating of the test circuit;
    applying power to the test circuit; and
    measuring an electrical parameter of the test circuit, wherein the electrical parameter is related to the temperature of the test circuit.

2. The method of claim 1, wherein the step of applying power to the heating element comprises:
    applying AC power to the heating element to provide controlled heating of the test circuit with a current so as to substantially avoid electromigration in the heating element whereby the heating element is operated at a temperature exceeding a standard operating temperature of the semiconductor device and whereby the characteristics of the AC power are controlled by a controller.

3. The method of claim 2, wherein the step of applying power to the test circuit comprises:
    applying DC power to the test circuit and measuring an electrical parameter of the test circuit, wherein the DC power is applied to the test circuit from a source separate from a source of the AC power.

4. The method of claim 2, wherein the AC power is turned on and off at a predetermined rate to expose the test circuit to temperature cycling.

5. A method of testing a semiconductor fabrication process, the method comprising the steps of:
    forming a semiconductor device including an integrated test circuit and a heating element, wherein the heating element includes a plurality of circuit meanders, one or more first meanders positioned in a horizontal plane around a test circuit, and one or more second meanders in a vertical plane around the test circuit, wherein the one or more first meanders and the one or more second meanders surround the test circuit within a three-dimensional space;
    applying power to the heating element to provide heating of the test circuit, wherein the applied power is AC power with a current so as to substantially avoid electromigration in the heating element, whereby the heating element is operated at a temperature exceeding a standard operating temperature of the semiconductor device and whereby the characteristics of the AC power are controlled by a controller; and
    applying power to the test circuit;
    measuring an electrical parameter of the test circuit, wherein the electrical parameter is related to the temperature of the test circuit.

6. A semiconductor test apparatus comprising:
    a heating element including a plurality of circuit meanders, one or more first meanders positioned in a horizontal plane around a test circuit, and one or more second meanders in a vertical plane around the test circuit, wherein the one or more first meanders and the one or more second meanders surround the test circuit within a three-dimensional space;
    a first power supply for applying power to the heating element to provide heating of the test circuit;
    a second power supply for applying power to the test circuit; and
    a test device for measuring an electrical parameter of the test circuit, wherein the electrical parameter is related to the temperature of the test circuit.

7. The invention of claim 6, wherein the first power supply comprises:
an AC power supply for providing power to the heating element to provide controlled heating of the test circuit with a current so as to substantially avoid electromigration in the heating element, whereby the heating element is operated at a temperature exceeding a standard operating temperature of the semiconductor device and whereby the characteristics of the AC power are controlled by a controller.

8. The invention of claim 7, wherein the second power supply comprises:
a DC power supply for applying DC power to the test circuit.

9. The invention of claim 7, wherein the AC power supply is turned on and off at a predetermined rate to expose the test circuit to temperature cycling.

10. A method comprising the steps of:
forming a semiconductor device including an integrated test circuit and a heating element, wherein the heating element includes a plurality of circuit meanders, one or more first meanders positioned in a horizontal plane around a test circuit, and one or more second meanders in a vertical plane around the test circuit, wherein the one or more first meanders and the one or more second meanders surround the test circuit within a three-dimensional space;
applying AC power to the heating element to provide controlled heating of the test circuit with a current so as to substantially avoid electromigration in the heating element, whereby the heating element is operated at a temperature exceeding a standard operating temperature of the semiconductor device applying power to the test circuit and whereby the characteristics of the AC power are controlled by a controller; and
measuring an electrical parameter of the test circuit, wherein the electrical parameter is related to the temperature of the test circuit.

11. A semiconductor test apparatus comprising:
a heating element including a plurality of circuit meanders, one or more first meanders positioned in a horizontal plane around a test circuit, and one or more second meanders in a vertical plane around the test circuit, wherein the one or more first meanders and the one or more second meanders surround the test circuit within a three-dimensional space;
an AC power supply for providing power to the heating element to provide controlled heating of the test circuit with a current so as to substantially avoid electromigration in the heating element, whereby the heating element is operated at a temperature exceeding a standard operating temperature of the semiconductor device and whereby the characteristics of the AC power are controlled by a controller;
a second power supply for applying power to the test circuit; and
a test device for measuring an electrical parameter of the test circuit, wherein the electrical parameter is related to the temperature of the test circuit.

* * * * *